(12) United States Patent
Riggs et al.

(10) Patent No.: US 10,707,107 B2
(45) Date of Patent: Jul. 7, 2020

(54) ADAPTIVE ALIGNMENT METHODS AND SYSTEMS

(71) Applicant: KLA-Tencor Corporation, Milpitas, CA (US)

(72) Inventors: Brent A. Riggs, Austin, TX (US); William Pierson, Austin, TX (US)

(73) Assignee: KLA-Tencor Corporation, Milpitas, CA (US)

( * ) Notice: Subject to any disclaimer, the term of this patent is extended or adjusted under 35 U.S.C. 154(b) by 215 days.

(21) Appl. No.: 15/261,218

(22) Filed: Sep. 9, 2016

(65) Prior Publication Data

US 2017/0178934 A1    Jun. 22, 2017

Related U.S. Application Data

(60) Provisional application No. 62/268,272, filed on Dec. 16, 2015.

(51) Int. Cl.
| | | |
|---|---|---|
| *H01L 21/67* | (2006.01) | |
| *G01B 11/27* | (2006.01) | |
| *G03F 9/00* | (2006.01) | |
| *G01N 21/95* | (2006.01) | |

(52) U.S. Cl.
CPC ...... *H01L 21/67259* (2013.01); *G01B 11/272* (2013.01); *G01N 21/9501* (2013.01); *G03F 9/7034* (2013.01); *G01N 2201/12* (2013.01)

(58) Field of Classification Search
CPC ..... G01N 21/9501; H01L 22/20; H01L 22/12; H01L 22/14; G06T 7/0004; H04N 7/18
See application file for complete search history.

(56) References Cited

U.S. PATENT DOCUMENTS

| | | | |
|---|---|---|---|
| 5,243,377 A | 9/1993 | Umatate et al. | |
| 5,649,169 A * | 7/1997 | Berezin | G01N 21/9501 |
| | | | 700/110 |
| 5,894,350 A * | 4/1999 | Hsieh | G03F 9/70 |
| | | | 250/548 |
| 5,900,707 A * | 5/1999 | Wakui | G03F 7/70358 |
| | | | 318/560 |
| 6,016,562 A * | 1/2000 | Miyazaki | G01R 31/01 |
| | | | 257/E21.53 |
| 6,410,927 B1 * | 6/2002 | Pike | G03F 7/70541 |
| | | | 250/491.1 |

(Continued)

FOREIGN PATENT DOCUMENTS

| | | |
|---|---|---|
| JP | 2006086163 A | 3/2006 |
| TW | I274391 B | 2/2007 |

OTHER PUBLICATIONS

International Search Report for PCT/US2016/066004 dated Mar. 27, 2017, 3 pages.

*Primary Examiner* — Lisa E Peters
(74) *Attorney, Agent, or Firm* — Suiter Swantz pc llo (57) ABSTRACT

Adaptive alignment methods and systems are disclosed. An adaptive alignment system may include a scanner configured to align a wafer and an analyzer in communication with the scanner. The analyzer may be configured to: recognize at least one defined analysis area; determine whether any perturbations exist within the analysis area; and in response to at least one perturbation determined to be within the analysis area, invoke a fall back alignment strategy or report the at least one perturbation to the scanner.

14 Claims, 6 Drawing Sheets

(56) References Cited

U.S. PATENT DOCUMENTS

| | | | |
|---|---|---|---|
| 6,528,219 B1* | 3/2003 | Conrad | G03F 7/70633 430/22 |
| 6,629,053 B1 | 9/2003 | Mooring | |
| 6,868,301 B1* | 3/2005 | Preil | G03F 9/7046 438/14 |
| 6,914,666 B2 | 7/2005 | Oishi | |
| 6,946,411 B2 | 9/2005 | Knappe et al. | |
| 7,042,552 B1 | 5/2006 | Werkman et al. | |
| 7,129,147 B2 | 10/2006 | Kumagai et al. | |
| 2002/0012858 A1* | 1/2002 | Kawakubo | G03F 7/70358 430/22 |
| 2003/0049872 A1* | 3/2003 | Look | G01B 7/003 438/14 |
| 2006/0092419 A1 | 5/2006 | Gui | |
| 2007/0020785 A1 | 1/2007 | Bruland et al. | |
| 2007/0200276 A1* | 8/2007 | Mackey | B82Y 10/00 264/293 |
| 2008/0101912 A1 | 5/2008 | Martin et al. | |
| 2009/0279989 A1 | 11/2009 | Wong et al. | |
| 2010/0073671 A1* | 3/2010 | Chou | G03F 7/70633 356/237.4 |
| 2010/0139836 A1* | 6/2010 | Horikoshi | H01L 21/67092 156/64 |
| 2011/0069154 A1* | 3/2011 | Case | G01N 21/9501 348/46 |
| 2011/0133066 A1* | 6/2011 | Nozoe | H01J 37/265 250/252.1 |
| 2012/0140193 A1* | 6/2012 | Chiu | H01L 23/544 355/53 |
| 2012/0179419 A1* | 7/2012 | Chen | H01L 22/12 702/155 |
| 2014/0218503 A1* | 8/2014 | Gerling | G01B 7/28 348/92 |
| 2015/0146188 A1* | 5/2015 | Lyulina | G03F 7/70633 355/77 |

* cited by examiner

FIG. 1

FIELD USED FOR ALIGNMENT

FIG.4

FIELD USED FOR ALIGNMENT

ADAPTIVE ALIGNMENT METHODS AND SYSTEMS

CROSS-REFERENCE TO RELATED APPLICATIONS

The present application claims the benefit under 35 U.S.C. § 119(e) of U.S. Provisional Application Ser. No. 62/268,272, filed Dec. 16, 2015. Said U.S. Provisional Application Ser. No. 62/268,272 is hereby incorporated by reference in its entirety.

TECHNICAL FIELD

The disclosure generally relates to the field of semiconductor fabrication, and particularly to alignment methods and systems utilized during semiconductor fabrication.

BACKGROUND

Thin polished plates such as silicon wafers and the like are a very important part of modern technology. A wafer, for instance, may refer to a thin slice of semiconductor material used in the fabrication of integrated circuits and other devices. Other examples of thin polished plates may include magnetic disc substrates, gauge blocks and the like. While the technique described here refers mainly to wafers, it is to be understood that the technique also is applicable to other types of polished plates as well. The term wafer and the term thin polished plate may be used interchangeably in the present disclosure.

Fabricating semiconductor devices typically includes processing a substrate such as a semiconductor wafer using a number of semiconductor fabrication processes. Lithography, for example, is a process that can be used to pattern parts (or the entirety) of a wafer. Lithography may be carried out using projection exposure systems such as scanners or the like.

Typically, the wafer is aligned and a focus leveling map is determined prior to the exposure. The focus leveling information may contain small perturbations (may also be referred to as focus spots) that are caused by various sources of front side and backside contamination. In addition to causing imaging issues during the exposure, these focus spots can impact alignment and, as a result, overlay of the current exposure layer compared to the previous layer. The reason for this is that a focus spot can cause local deformation of the wafer shape in the area immediately on or around the alignment mark, causing the tool to measure the alignment mark location at a slightly different location than it would have measured had no local deformation been present. As a result, this measured location data is used in the regression analysis and determination of the alignment model terms. This information is then applied to the scanner stage during exposure to ensure proper positioning between a reticle, lens, and wafer and therefore, better overlay. When these correction values are calculated incorrectly or suboptimally, loss of overlay control and reduction in overlay accuracy occur as the result.

Therein lies a need for providing effective and accurate alignment methods and systems.

SUMMARY

The present disclosure is directed to a system. The system may include a scanner configured to align a wafer and an analyzer in communication with the scanner. The analyzer may be configured to: recognize at least one defined analysis area; determine whether any perturbations exist within the analysis area; and in response to at least one perturbation determined to be within the analysis area, invoke a fall back alignment strategy or report the at least one perturbation to the scanner.

A further embodiment of the present disclosure is directed to a method. The method may include: aligning a wafer; recognizing at least one analysis area defined for the wafer; determining whether any perturbations exist within the analysis area; and in response to at least one perturbation determined to be within the analysis area, invoking a fall back alignment strategy to align the wafer.

An additional embodiment of the present disclosure is directed to a method. The method may include aligning a wafer; recognizing at least one analysis area defined for the wafer; determining whether any perturbations exist within the analysis area; and in response to at least one perturbation determined to be within the analysis area, reporting the at least one perturbation to a user or a user system to adjust alignment of the wafer.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Embodiments in accordance with the present disclosure are directed to adaptive alignment methods and systems. Adaptive alignment methods configured in accordance with the present disclosure are adaptively controlled to reduce impact of perturbations such as scanner focus and/or chuck spots. More specifically, an adaptive alignment method configured in accordance with the present disclosure may include detection of perturbations occurring due to various sources of contamination and adaptively react based on the detection result. In some embodiments, the adaptive alignment method may be configured to analyze and flag the detected perturbations (e.g., providing a run-time method for alerting the customer host system of the detected perturbations). Alternatively and/or additionally, the adaptive alignment method may be configured to invoke one or more fall back alignment strategies following the detection of these perturbations. The fall back alignment strategies may be designed to promote improved (or optimal) alignment and overlay.

Figure 1:
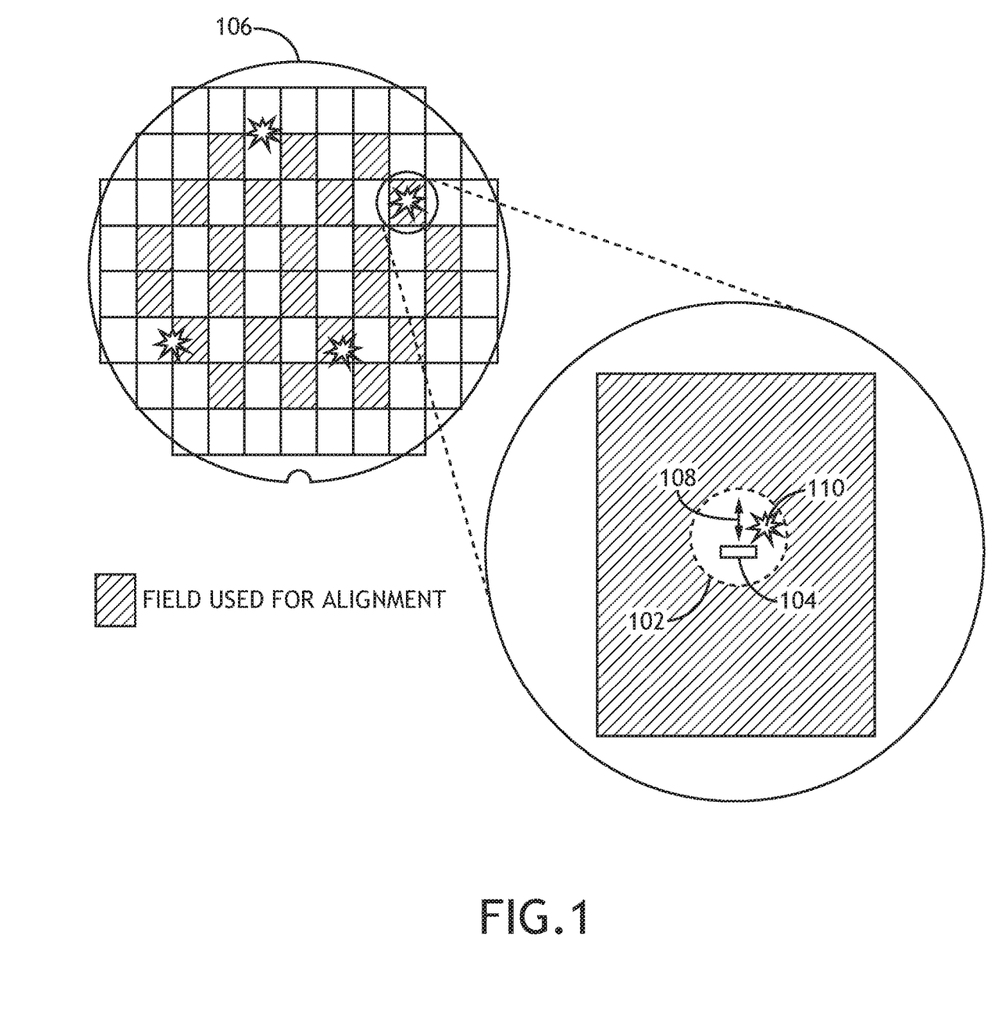
FIG. 1 is an illustration depicting an analysis area defined around an alignment mark provided on a wafer.
Figure 2:
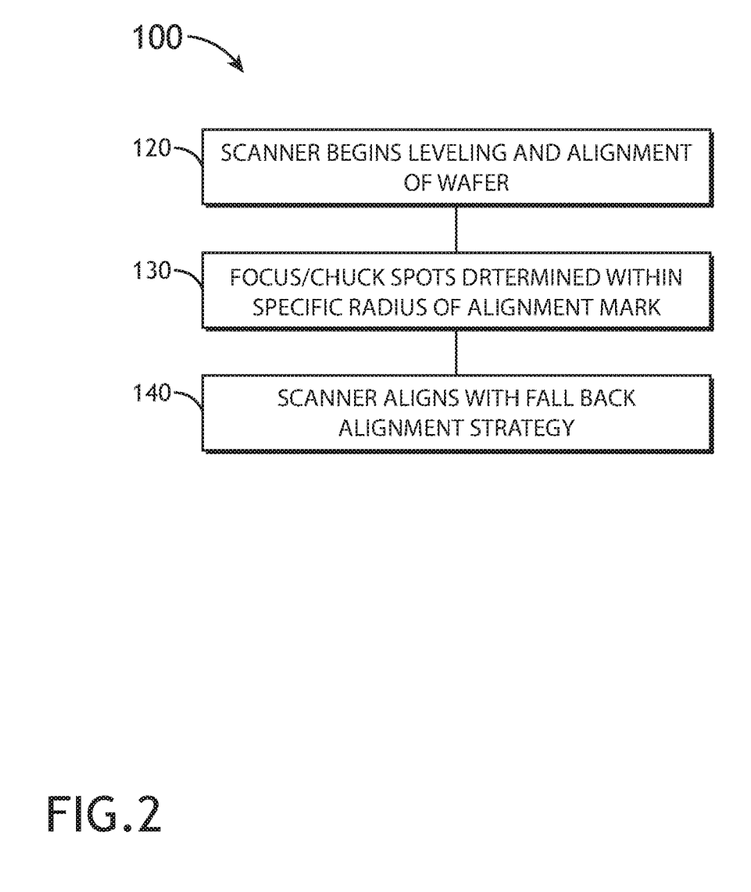
FIG. 2 is an illustration depicting the process flow of an adaptive alignment method configured in accordance with an embodiment of the present disclosure.
Figure 3:
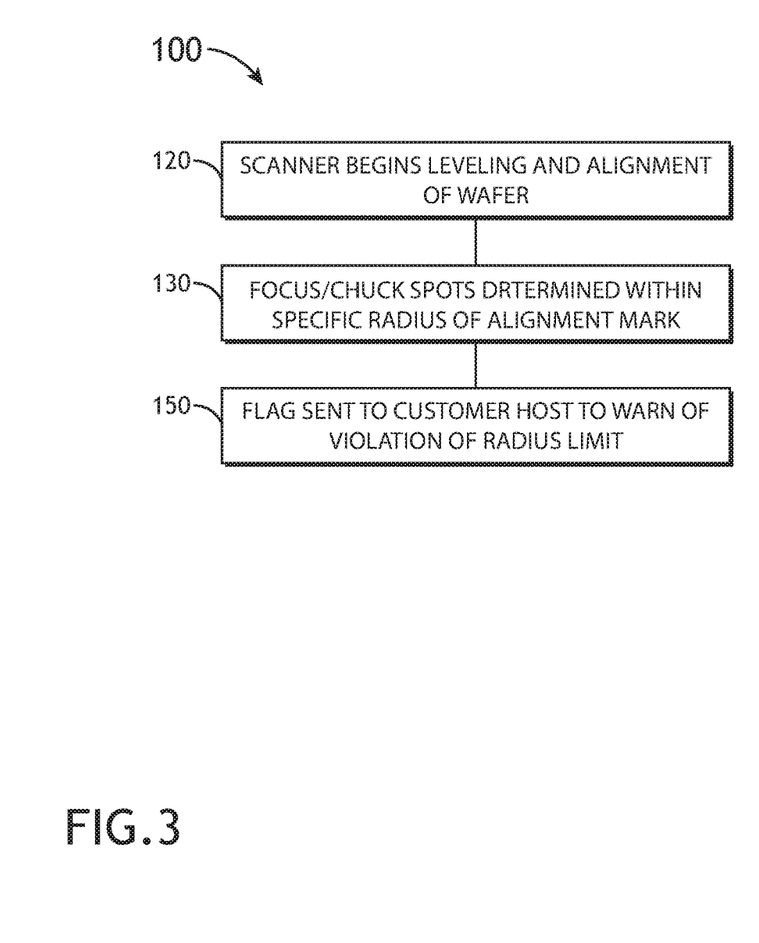
FIG. 3 is an illustration depicting the process flow of another adaptive alignment method configured in accordance with an embodiment of the present disclosure.

Referring now to FIGS. 1-3, illustrations depicting an adaptive alignment method 100 configured in accordance with some embodiments of the present disclosure is shown. The adaptive alignment method 100 may recognize one or more analysis areas 102 centered around one or more alignment marks 104 provided on a wafer 106. In some embodiments, the analysis areas 102 may be defined based on user specified or systematically determined radius values 108. Alternatively, analysis areas 102 having different shapes and sizes may be defined without departing from the spirit and the scope of the present disclosure.

It is to be understood that while the shapes and sizes of the analysis areas 102 may differ, they are provided for the same purpose, which is to help detect perturbations (e.g., focus/chuck spots and the like) 110 around the alignment marks 104. For example, a user may specify a 2 mm radius around each known alignment mark 104. The user may also specify a limit/threshold for the size of the detected perturbations 110 (e.g., 80 nm). In this manner, as the alignment method 100 commences in a step 120, if a perturbation 110 having a size greater than 80 nm is detected within the 2 mm radius of an alignment mark 104 in a step 130, the user specified rules may be considered to have been violated and certain actions may be triggered in a step 140 accordingly.

As shown in FIG. 2, the actions triggered in the step 140 may include a fall back alignment strategy. The fall back alignment strategy may be defined in a manner so that the alignment mark(s) 104' that triggered the violation(s) can be skipped/bypassed for alignment purposes. Alternatively, the fall back alignment strategy may be defined so that the alignment mark(s) 104' that triggered the violation(s) can still be used for alignment purposes, but are given lesser weight. It is contemplated that the fall back alignment strategy may be defined in various other manners without departing from the spirit and the scope of the present disclosure.

It is also contemplated that the fall back alignment strategy is not required to be defined. As shown in FIG. 3, an alternative reporting step 150 may be invoked to flag the alignment mark(s) 104' that triggered the violation(s) and report the flagged alignment mark(s) 104' to a user or a user system (e.g., a scanner system) that initiated the alignment process. It is contemplated that by providing such a report to the user or the user system, the adaptive alignment method 100 configured in accordance with the present disclosure may effectively provide the user or the user system the abilities to handle potential problems that may be caused by the perturbations 110. In some embodiments, for example, the user or the user system may decide how to disposition the wafer (or the wafer lot) 106 based on the report provided in the step 150.

As will be appreciated from the above, the adaptive alignment method 100 configured in accordance with the present disclosure may directly impact and improve product yield by providing run-time detection and resolution of potentially damaging process conditions during the lithography process. It is contemplated that adaptive alignment methods configured in accordance with the present disclosure may be particularly suitable for scanners that implement simultaneous alignment and leveling. It is to be understood, however, that the adaptive alignment methods configured in accordance with the present disclosure are not limited to scanners; it is contemplated that the adaptive alignment methods configured in accordance with the present disclosure may be utilized in various other types of systems and/or devices without departing from the spirit and the scope of the present disclosure.

Figure 4:
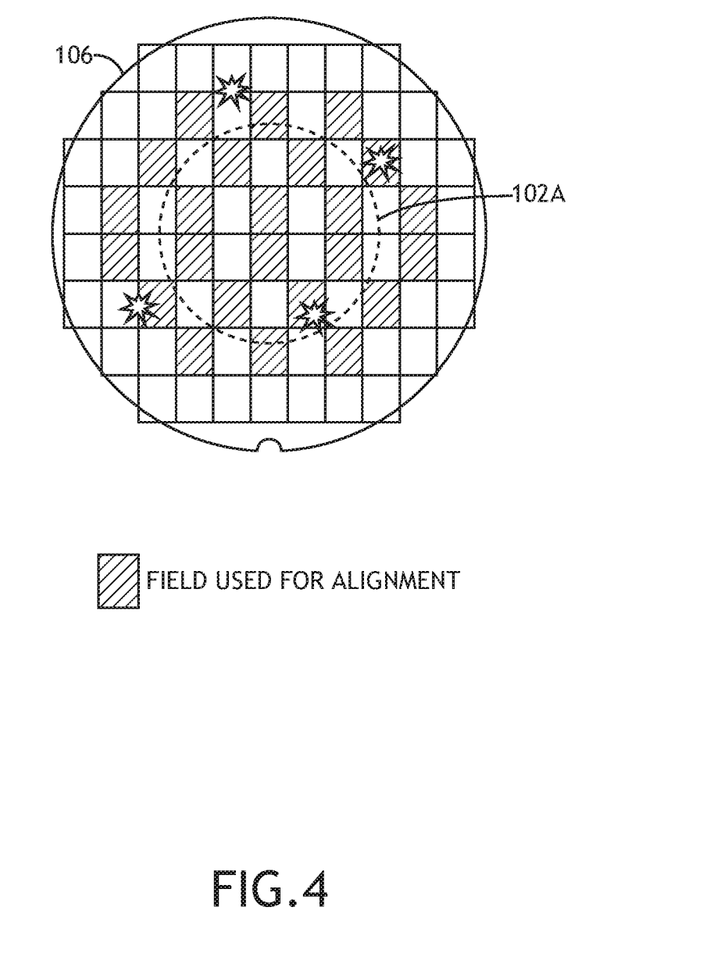
FIG. 4 is an illustration depicting an analysis area defined for a wafer.
Figure 5:
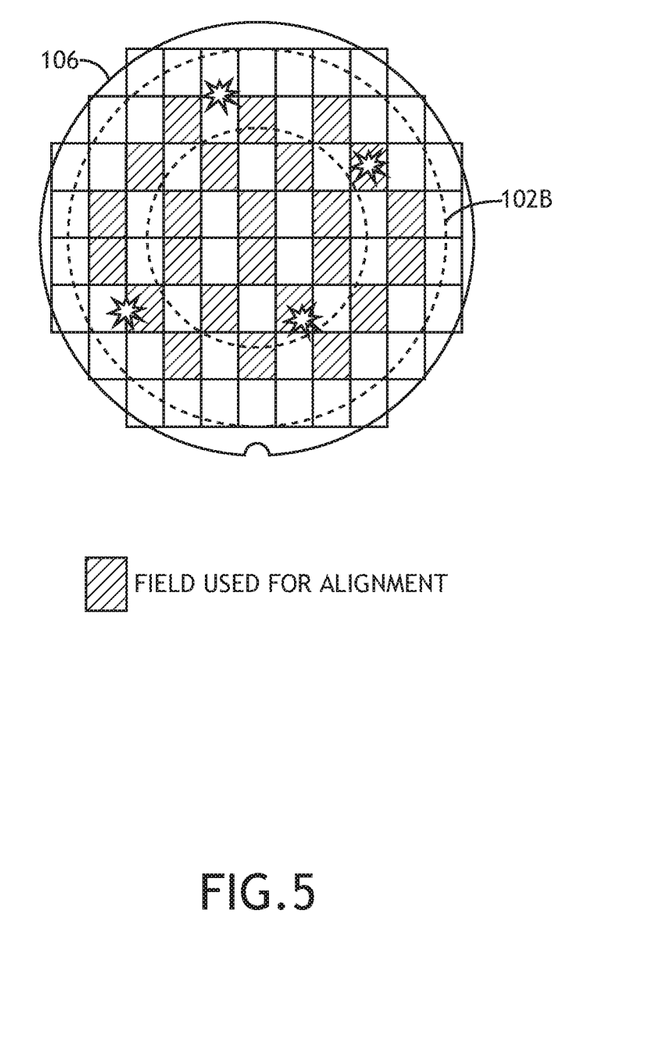
FIG. 5 is an illustration depicting another analysis area defined for a wafer.

It is also contemplated that the adaptive alignment methods configured in accordance with the present disclosure may define the analysis areas 102 in various different manners without departing from the spirit and the scope of the present disclosure. In some embodiments, for example, a user may not need to set up specific analysis areas 102 around the alignment marks 104 as depicted in FIG. 1, and choose instead to set up an area (may also be referred to as a zone or a region) with limits and actions for how to proceed with wafer processing should the limit be violated. FIGS. 4 and 5 are simplified examples showing such areas 102A and 102B.

More specifically, the area 102A shown in FIG. 4 may be defined to include a simple radius set from the center of the wafer 106 (e.g., defining an area from the center of the wafer out to 50 mm). The user may further define that if one or more focus spots of 100 nm or larger are detected in this area, a fall back alignment strategy (e.g., one that has less sampling in this specific area) may be triggered, or the wafer 106 may be flagged and reported so that the user or the user system can be informed of the number of focus spots larger than 100 nm that violated the limit within the area 102A in manners similar to that described above. It is to be understood that the focus or chuck spots do not need to necessarily be larger than 100 nm and that the examples provided herein are merely for illustrative purposes. It is to be understood that the limits may be set to different values without departing from the spirit and the scope of the present disclosure.

FIG. 5 shows another exemplary area 102B that can be defined for perturbation analysis. The area 102B may be defined between a 90 mm inner radius and a 110 mm outer radius. According to this definition, the wafer 106 may be processed normally if there are focus spots in areas outside of the defined area 102B. On the other hand, if focus spots larger than the defined limits are detected within the defined area 102B, the fall back alignment strategy or the reporting process may be triggered.

It is to be understood that the areas 102A and 102B depicted in the examples above are merely for illustrative purposes and are not meant to be limiting. It is contemplated that the areas may be defined/implemented in various other manners without departing from the spirit and the scope of the present disclosure. For example, a user may define a first area (e.g., a 0-50 mm area) where the action triggered in the event of a violation is to flag and report the violation. The user may define a second area (e.g., from 51-100 mm) where a fall back alignment strategy is used if a violation of a limit is detected. It is contemplated that additional areas and actions may be defined without departing from the spirit and the scope of the present disclosure.

Figure 6:
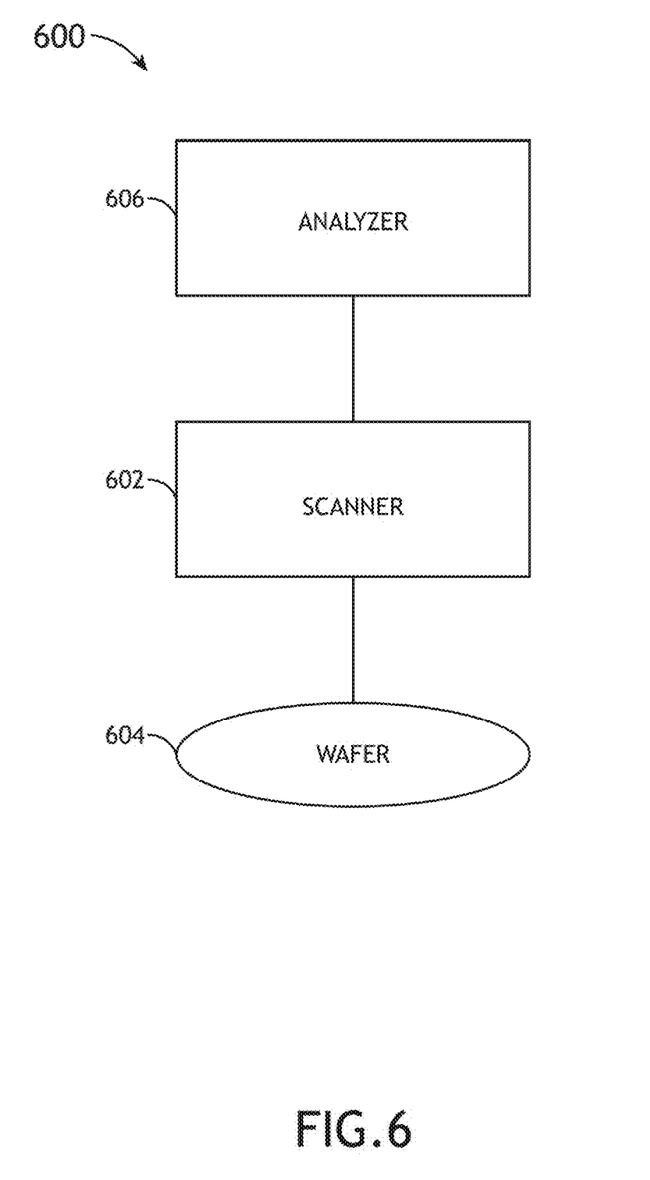
FIG. 6 is a block diagram depicting a system configured in accordance with an embodiment of the present disclosure.

Referring now to FIG. 6, a block diagram depicting a system 600 configured in accordance with embodiments of the present disclosure is shown. The system 600 may include a scanner 602 configured to level and align a wafer 604 prior to exposure. The scanner 602 may also be configured to communicate with an analyzer 606. The analyzer 606 may be implemented on a computer processor, a circuitry or the like, and is capable of carrying out the various analysis processes previously described.

More specifically, the analyzer 606 may be configured to recognize one or more analysis areas defined as previously described and determine whether any focus/chuck spots that violate the defined limit(s) exist within the recognized analysis areas. If a violation of a limit occurs, one of the actions (e.g., invoke a fall back alignment strategy or flag and report the violation) may be triggered. In some embodiments, the communication between the scanner 602 and the analyzer 606 may be performed in real-time to allow adjustments (e.g., in case a fall back alignment strategy is triggered) to take place. In some embodiments, the scanner 602 may communicate with the analyzer 606 before or after a lot processing ends.

It is contemplated that while some of the examples above referred to certain specific process tools (e.g., scanners), the systems and methods in accordance with the present disclosure are applicable to other types of process tools, which may also benefit from improved alignment control without departing from the spirit and scope of the present disclosure. In addition, it is to be understood that while the examples above referred to wafers, the systems and methods in accordance with the present disclosure are applicable to other types of polished plates as well without departing from the spirit and scope of the present disclosure. The term wafer used in the present disclosure may include a thin slice of semiconductor material used in the fabrication of integrated circuits and other devices, as well as other thin polished plates such as magnetic disc substrates, gauge blocks and the like.

It is contemplated that the methods described in the present disclosure may be implemented in various wafer geometry measurement tools as sets of instructions executed by one or more processors, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and the apparatus of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A system, comprising:
    a scanner configured to align a wafer based on a first plurality of alignment fields of the wafer; and
    an analyzer in communication with the scanner, wherein the analyzer is configured to:
        recognize at least one analysis area around at least one alignment mark provided on the wafer within at least one alignment field of the first plurality of alignment fields, wherein the at least one analysis area is defined by an area of a selected size centered around the at least one alignment mark;
        detect at least one perturbation in the at least one analysis area within the at least one alignment field of the first plurality of alignment fields, wherein the at least one perturbation is proximate to the at least one alignment mark; and
        report the at least one perturbation to the scanner, wherein the scanner is adjusted based on a fall back alignment strategy in response to the at least one perturbation detected in the at least one analysis area, wherein the fall back alignment strategy configures the scanner to realign the wafer based on a second plurality of alignment fields to bypass the at least one perturbation, wherein the second plurality of alignment fields includes at least one different alignment field than the first plurality of alignment fields.

2. The system of claim 1, wherein the at least one perturbation comprises at least one of a focus spot or a chuck spot.

3. The system of claim 1, wherein the second plurality of alignment fields of the fall back alignment strategy are defined to bypass the at least one different alignment field of the first plurality of alignment fields where the at least one perturbation is detected in the at least one analysis area.

4. The system of claim 1, wherein the analyzer is configured to:
    recognize at least one perturbation size limit for the at least one analysis area; and
    detect when the at least one perturbation in the at least one analysis area is larger than the at least one perturbation size limit.

5. The system of claim 4, wherein the scanner is adjusted based on the fall back alignment strategy in response to the at least one perturbation detected in the at least one analysis area when the at least one perturbation in the at least one analysis area is larger than the at least one perturbation size limit.

6. A method, comprising:
    aligning a wafer via a scanner based on a first plurality of alignment fields of the wafer;
    recognizing at least one analysis area defined for the wafer around at least one alignment mark provided on the wafer within at least one alignment field of the first plurality of alignment fields, wherein the at least one analysis area is defined by an area of a selected size centered around the at least one alignment mark;
    detecting at least one perturbation in the at least one analysis area within the at least one alignment field of the first plurality of alignment fields, wherein the at least one perturbation is proximate to the at least one alignment mark; and
    adjusting the scanner based on a fall back alignment strategy in response to the at least one perturbation detected in the at least one analysis area, wherein the fall back alignment strategy configures the scanner to realign the wafer based on a second plurality of alignment fields to bypass the at least one perturbation, wherein the second plurality of alignment fields includes at least one different alignment field than the first plurality of alignment fields.

7. The method of claim 6, wherein the at least one perturbation comprises at least one of a focus spot or a chuck spot.

8. The method of claim 6, wherein the second plurality of alignment fields of the fall back alignment strategy are defined to bypass the at least one different alignment field of the first plurality of alignment fields where the at least one perturbation is detected in the at least one analysis area.

9. The method of claim 6, further comprising:
recognizing at least one perturbation size limit for the at least one analysis area;
detecting when the at least one perturbation in the at least one analysis area is larger than the at least one perturbation size limit; and
adjusting the scanner based on the fall back alignment strategy in response to the at least one perturbation detected in the at least one analysis area being larger than the at least one perturbation size limit.

10. The method of claim 6, further comprising:
reporting the at least one perturbation to at least one of a user or the scanner.

11. A method, comprising:
aligning a wafer via a scanner based on a first plurality of alignment fields of the wafer;
recognizing at least one analysis area defined for the wafer around at least one alignment mark provided on the wafer within at least one alignment field of the first plurality of alignment fields, wherein the at least one analysis area is defined by an area of a selected size centered around the at least one alignment mark;
detecting at least one perturbation in the at least one analysis area within the at least one alignment field of the first plurality of alignment fields, wherein the at least one perturbation is proximate to the at least one alignment mark;
reporting the at least one perturbation to the scanner; and
adjusting the scanner based on a fall back alignment strategy in response to the at least one perturbation detected in the at least one analysis area, wherein the fall back alignment strategy configures the scanner to realign the wafer based on a second plurality of alignment fields to bypass the at least one perturbation, wherein the second plurality of alignment fields includes at least one different alignment field than the first plurality of alignment fields.

12. The method of claim 11, wherein the at least one perturbation comprises at least one of a focus spot or a chuck spot.

13. The method of claim 11, further comprising:
recognizing at least one perturbation size limit for the at least one analysis area;
detecting when the at least one perturbation in the at least one analysis area is larger than the at least one perturbation size limit; and
adjusting the scanner based on the fall back alignment strategy in response to the at least one perturbation detected in the at least one analysis area being larger than the at least one perturbation size limit.

14. The method of claim 13, wherein the second plurality of alignment fields of the fall back alignment strategy are defined to bypass the at least one different alignment field of the first plurality of alignment fields where the at least one perturbation is detected in the at least one analysis area.

* * * * *